United States Patent [19]

Peters

[11] Patent Number: 4,543,271
[45] Date of Patent: Sep. 24, 1985

[54] SILICON OXYNITRIDE MATERIAL AND PHOTOCHEMICAL PROCESS FOR FORMING SAME

[75] Inventor: John W. Peters, Malibu, Calif.

[73] Assignee: Hughes Aircraft Company, El Segundo, Calif.

[21] Appl. No.: 627,366

[22] Filed: Jul. 2, 1984

[51] Int. Cl.[4] ............................................. B05D 3/14
[52] U.S. Cl. ...................................... 427/54.1; 427/35
[58] Field of Search ....................... 427/53.1, 54.1, 35, 427/36; 204/157.1 R, 157.1 H

[56] References Cited

U.S. PATENT DOCUMENTS

| | | | |
|---|---|---|---|
| 4,181,751 | 1/1980 | Hall et al. | 427/53.1 |
| 4,282,270 | 8/1981 | Nozaki et al. | 427/93 |
| 4,289,797 | 9/1981 | Akselrad | 427/39 |
| 4,363,868 | 12/1982 | Takasaki et al. | 430/314 |
| 4,371,587 | 2/1983 | Peters | 204/157.1 R |

OTHER PUBLICATIONS

Rand et al., "Silicon Oxynitride Films from the NO—NH$_3$—SiH$_4$ Reaction" J. Electrochem. Soc., vol. 120, No. 3, Mar. 1973, pp. 446-453.

*Primary Examiner*—Howard S. Williams
*Attorney, Agent, or Firm*—Mary E. Lachman; A. W. Karambelas

[57] ABSTRACT

An improved silicon oxynitride material which is homogeneously chemically bonded and contains minimal free amorphous silicon has improved electrical insulating properties, hardness, scratch resistance, and adhesion. This material is formed on the surface of a selected substrates by a photochemical vapor deposition reaction. First a vapor mixture is formed comprising: ammonia and silane reactants in the ratio of 80:1 or higher; mercury vapors as a sensitizer for the desired photochemical reaction; and a predetermined amount of oxygen. This vapor mixture is introduced into a photochemical vapor deposition chamber containing the selected substrate, and radiation of a predetermined wavelength is simultaneously introduced into the deposition chamber. The selected radiation induces a photochemical reaction between the silane, ammonia, and oxygen to form silicon oxynitride which deposits on the substrate surface. The oxygen reacts with any excess silane to chemically bond and homogeneously incorporate the silicon from the excess silane into the silicon oxynitride material. Thus, the formation of free amorphous silicon from the silane and the heterogeneous incorporation thereof into the silicon oxynitride material are prevented.

8 Claims, 2 Drawing Figures

SILICON OXYNITRIDE MATERIAL AND PHOTOCHEMICAL PROCESS FOR FORMING SAME

The Government of the United States of America has rights in this invention pursuant to Contract No. F33615-79-C-5055 awarded by the Department of the Air Force.

BACKGROUND OF THE INVENTION

1. Field of the Invention

This invention relates generally to the formation of an improved silicon oxynitride material and to a photochemical vapor deposition process for forming this material.

2. Description of the Prior Art

In the fabrication of semiconductor integrated circuits and devices, a layer of silicon nitride ($Si_3N_4$) is frequently used as a dielectric layer to provide electrical insulation between adjacent structures or circuits and prevent unwanted current flow therebetween. In addition, a silicon nitride layer is often used as a passivation layer on a device to prevent contamination of the device by air, moisture, mobile ions, and other impurities which might cause corrosion and degradation of device performance. Further a silicon nitride layer may be used as a mask during such device fabrication processes as ion implantation, ion diffusion, and metal deposition. In all such uses of silicon nitride, it is important to have a dielectric material with good electrical and morphological integrity, good hardness and scratch resistance, and good adhesion to the substrate.

Silicon nitride layers of good quality have been prepared by a conventional chemical vapor deposition reaction or thermal process, from silane and ammonia reactants at temperatures between 800° and 100° C., as described, for example, by J. A. Amick, G. L. Schnable, and J. L. Vossen, in the article entitled "Deposition techniques for dielectric films on semiconductor devices," in the *Journal of Vacuum Science and Technology*, Vol. 14, No. 5, Sept./Oct. 1977, at page 1059. However, in the fabrication of certain semiconductor devices, a high temperature produces undesirable side-effects, such as diffusion and boundary migration of existing structures on the device or decomposition of a compound semiconductor material, such as gallium, indium phosphide, or mercury cadmium telluride.

Consequently, it is frequently advantageous to use a low-temperature process for depositing a layer of silicon nitride on a temperature-sensitive device. Silicon nitride layers have been prepared at relatively low-temperature by using a photochemical reaction i.e. a chemical reaction which is induced or initiated by radiation, and such layers are referred to herein as "photonitride" layers. One process for depositing a $Si_3N_4$ layer uses a photosensitized reaction between silane ($SiH_4$) and hydrazine ($N_2H_4$), as discussed by M. G. Collet, in the publication entitled "Depositing Silicon Nitride Layers at Low Temperature Using a Photochemical Reaction," in the *Journal of the Electrochemical Society: SOLID STATE SCIENCE AND TECHNOLOGY*, Vol. 116, No. 1, January 1969, pages 110-111 and in U.S. Pat. No. 3,620,827. In such a process, mercury (Hg) is excited by radiation of a particular wavelength (i.e. 2537 angstroms) to form mercury in an excited state (Hg*). The Hg* then collides with the $SiH_4$ and the $N_2H_4$ to cause these molecules to form radicals which then interact to form $Si_3N_4$. Further studies of this process, as well as of a fast-flow system which uses a mixture of $SiH_4$ and ammonia ($NH_3$), are reported by C. H. J. v. d. Brekel and P. J. Severin, the articles entitled "Control of the Deposition of Silicon Nitride Layers by 2537 Å Radiation," in the *Journal of the Electrochemical Society: SOLID STATE SCIENCE AND TECHNOLOGY*, Vol. 19, No. 3, March 1972, pages 372-376.

However, it was found that films prepared in accordance with the teachings referenced above had a high incidence of pinholes, which degraded the electrical integrity of the film and its electrical insulating properties. In order to improve upon these films, I co-discovered and developed a process for the preparation of low temperature photonitride films of good quality and containing minimal chemically bonded oxygen, as disclosed in U.S. Pat. No. 4,181,751 to T. C. Hall and J. W. Peters, assigned to the present assignee. By the process disclosed in the latter patent, a silane getter technique is used to remove oxygen and moisture from the nitrogen-containing reactants, in conjunction with a mercury vapor photosensitized reaction of a predetermined vapor mixture of silane, ammonia, and hydrazine at temperatures from 100° C. to 300° C. The silicon nitride layer formed by the above-described process was found to be substantially free of pinholes.

Furthermore, it was found that silicon nitride films prepared by the process of Collet described above typically exhibited poor scratch resistance and hardness characteristics, unacceptable adhesion, and irreproducible electrical properties, such as breakdown voltage, dielectric constant, and dissipation factor.

I have discovered that the material formed by the process of Collet is not a pure silicon nitride material, but rather a heterogeneous composition of silicon nitride and silicon oxynitride with free amorphous silicon incorporated therein. I have further discovered that the undesirable properties of this prior art silicon nitride material discussed above are directly related to the nature of its heterogeneous composition.

It is the alleviation of this prior art problem of the undesirable electrical and physical properties of a silicon nitride layer formed by photochemical vapor deposition to which the present invention is directed.

SUMMARY OF THE INVENTION

The purpose of the present invention is to provide a new and improved silicon oxynitride material which contains minimal free amorphous silicon, and further, to provide a process for forming this new and improved material.

In order to accomplish this purpose, I have discovered and developed a photochemical vapor deposition process for depositing a layer of a new and improved silicon oxynitride material on the surface of a selected substrate. First, a vapor mixture is formed comprising: a chosen nitrogen-containing compound and a chosen silicon containing compound capable of undergoing a photochemical reaction to form a silicon nitride material, these compounds being provided in a predetermined ratio and at predetermined flow rates; mercury vapors as a sensitizer for the desired photochemical reaction; and a predetermined amount of an oxygen-containing compound. This vapor mixture is introduced into a photochemical vapor deposition chamber containing the selected substrate, and radiation of a predetermined wavelength is simultaneously introduced into the deposition chamber. The selected radiation induces a photochemical reaction between the nitrogen-containing compound, the silicon-containing compound and the oxygen-containing compound to form silicon oxynitride which deposits on the substrate surface. The oxygen-containing compound present during the formation of the silicon oxynitride material reacts with any excess silicon-containing compound to chemically bond and homogeneously incorporate the silicon from the excess silicon-containing compound into the silicon oxynitride material, thus preventing the formation of free amorphous silicon and the heterogeneous incorporation of free amorphous silicon into the silicon oxynitride material.

Accordingly, it is a purpose of the present invention to provide a new and improved silicon oxynitride material which contains minimal free amorphous silicon.

Another purpose is to provide a silicon nitride-type material having optimized hardness, scratch resistance, adhesion, and electrical insulating properties.

Still another purpose is to provide a silicon oxynitride material which is homogeneously chemically bonded.

Another purpose is to provide a silicon nitride-type material having optimized physical and electrical properties and which can be deposited by a photochemical vapor deposition process.

Yet another purpose of the present invention is to provide a photochemical vapor deposition process for forming the above-described improved silicon oxynitride material.

The foregoing and other advantages and features of the present invention will be apparent from the following more particular description of the preferred embodiments of the invention and as illustrated in the accompanying drawings.

DETAILED DESCRIPTION OF THE INVENTION

Figure 1:
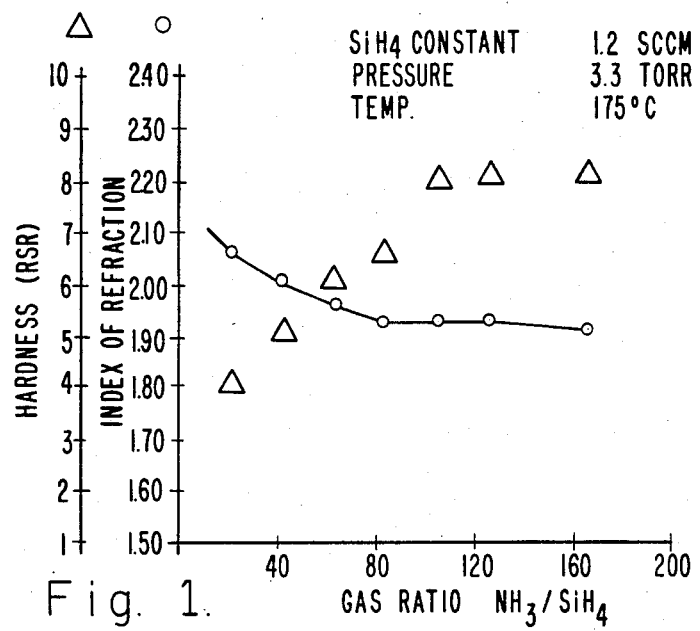
FIG. 1 presents a curve showing the relationship between: (1) the refractive index and, optionally, the hardness of the improved silicon oxynitride material of the present invention; and (2) the ratio of the $NH_3$ and $SiH_4$ reactants used to form this material at a $SiH_4$ flow rate of 1.2 standard cubic centimeters per minute.

In the past, it has been believed that the figure of merit for a silicon nitride material is a refractive index (n) of 2.0, that is, a silicon nitride material with n=2.0 was considered to be represented by the chemical formula $Si_3N_4$, as disclosed, for example in the publication by Collet, previously referenced herein. Consequently, prior art photonitride deposition processes were optimized to achieve a refractive index of 2.0. However, it has been reported by K. E. Bean et al in the publication entitled "Some properties of vapor deposited silicon nitride films using the $SiH_4$—$NH_3$—$H_2$ system" in the *Journal of the Electrochemical Society*, Vol. 114, 1967, at page 733 et seq, that in the formation of silicon nitride layers by a thermal process, as previously described herein, at low ratios of $NH_3$:$SiH_4$, the deposited layers had refractive indices greater than 2.0 and these values approached 4.0 (i.e. the value for silicon) as the $NH_3$:$SiH_4$ ratio approached zero. The existence of refractive indices greater than 2.0 was attributed to the inclusion of excess silicon in the $Si_3N_4$ films. In addition, the increase in the refractive index of the $Si_3N_4$ films prepared by this thermal process was found to correlate with decreased film hardness.

As a further development, I have discovered that photonitride films deposited by the process of Collet and optimized to have a refractive index of 2.0 comprise a heterogeneous composition of silicon nitride and silicon oxynitride with free amorphous silicon incorporated therein. Moreover, as discussed below in relation to Tables I and II herein, I have discovered that this heterogeneous composition of the prior art photonitride film is correlated with degraded electrical and physical properties of the deposited film.

Furthermore, it has been known that thermally formed silicon nitride films deposited in the presence of an oxygen background in the thermal chemical vapor deposition reaction chamber (i.e. ambient oxygen or air in the apparatus) will have refractive indices below 2.0, due to the incorporation of some oxygen into such films and the lower refractive index for silicon oxides. Such results are described, for example, by T. L. Chu, in the publication entitled "Films of silicon nitride-silicon oxide mixtures", in the *Journal of the Electrochemical Society*, Vol. 115, 1968, at page 318 et seq. Consequently, it is expected that a photonitride layer formed by the process of Collet would typically contain some oxygen, that is, the material would be a silicon oxynitride ($SiO_xN_y$), where $x+y=2$.

Based upon my above-described discoveries, I have developed a new and improved silicon oxynitride material which contains minimal free amorphous silicon and in which the silicon, oxygen and nitrogen components are homogeneously chemically bonded, to provide a material with improved electrical and physical properties. I have also discovered and developed a process for forming this new and improved silicon oxynitride material.

In accordance with the present invention, a new and improved silcon oxynitride material containing minimal free amorphous silicon is prepared by a mercury-sensitized photochemical vapor deposition reaction in which the ratio and flow rates of the reactants are controlled. The basic process described in U.S. Pat. No. 3,620,827, the details of which are incorporated herein by reference, is adapted for continuous-flow operation, as described by C. H. J. v. d. Brekel and P. H. Severin, in the publication entitled "Control of the Deposition of Silicon Nitride Layers by 2537 Å Radiation," previously referenced herein. In accordance with the present invention, ammonia and silane are used as the reactants, the ratio of $NH_3$:$SiH_4$ is maintained at 80:1 or higher, and the flow rate of the $SiH_4$ is maintained at a predetermined level. The net effect of this control of the reactant gas ratios and flow rates is to control the amount of silane reactant which is present in the reaction chamber at any given time to provide silicon for incorporation into the deposited film.

Using the prior art photonitride process for reacting $SiH_4$ and $NH_3$, for example, the efficiency of the reaction between the silyl and ammoniacal radicals formed under radiation inducement is low, with the net effect being that not all of the silicon atoms in the silyl radicals are converted to silicon-to-nitrogen bonds to produce $Si_3N_4$, but rather some silicon atoms are converted to amorphous silicon, which then becomes heterogeneously incorporated into the $Si_3N_4$ deposit. (The term "excess silicon" is used herein to refer to those silicon atoms other than those which are converted to silicon-nitrogen bonds.) This amorphous silicon may be in one of two forms: (a) a chain of —SiH$_x$— groups, usually —SiH$_3$—, linked together as a polymer; or (b) a chain of hydrogen-free Si atoms linked on end. In accordance with the present invention, the incorporation of excess or free amorphous silicon in the Si$_3$N$_4$ film is avoided, partly by providing a relatively high ratio of NH$_3$:SiH$_4$.

However, an additional part of the present invention is that the flow rate of the silane reactant must be controlled and a predetermined amount of an oxygen-containing compound must be present to react with any excess silicon-containing precursor. The term "excess silicon-containing precursor" is used herein to mean any silicon-containing precursor in excess of the stoichiometric amount required to form Si$_3$N$_4$. In accordance with the present invention, the silicon in any excess silicon-containing precursor is oxidized and thus is prevented from being converted to amorphous silicon.

When exposed to selected radiation in the presence of mercury vapors, certain oxygen-containing compounds, such as nitrous oxide, nitrogen dioxide, or molecular oxygen under selected conditions, are dissociated to produce atomic oxygen, as described in U.S. Pat. No. 4,371,587, assigned to the present assignee. This atomic oxygen then reacts with any excess silicon-containing radicals, such as silyl radicals, produced during the photochemical reaction to chemically bond the silicon into the silicon oxynitride material in a homogeneous fashion. In addition, the oxygen-containing compound may be provided by the background oxygen or air present in the photochemical vapor deposition reaction chamber after evacuation to a base pressure of about 5–20 millitorr, for example. If background oxygen is used, the amount of oxygen present depends on the quality of the vacuum formed in the reaction chamber, and the flow rate of the silane into the reaction chamber must be correspondingly controlled. At lower oxygen concentration, a slower flow rate of silane must be used to ensure that the oxygen reacts with all excess silicon-containing precursor. The optimum amount of oxygen may be determined by plotting curves similar to those shown in FIGS. 1 and 2 and discussed below, using varying operating pressures. When using other oxygen-containing precursors, the optimum amount of oxygen may be determined as discussed above, using a constant operating pressure and varying the amount of the oxygen-containing precursor.

This predetermined amount of oxygen forms a chemical bond with the silicon in any excess silicon-containing precursor, which may be present in the form of silicon-containing radicals, and thus prevents the formation of free amorphous silicon, which would then be incorporated per se into the deposited material. However, as a result of this reaction and chemical bonding between oxygen and silicon, the material deposited in accordance with the present invention is a silicon oxynitride material (SiO$_x$N$_y$), rather than pure Si$_3$N$_4$. (As previously discussed, due to the presence of an oxygen background in Collet's process, the material formed by Collet's process is probably also a silicon oxynitride. However, the material formed by Collet's process differs from the material formed by the present invention in that the former has the serious disadvantage of having free amorphous silicon heterogeneously mixed therewith).

Thus, the process of the present invention provides a silicon oxynitride material substantially free of amorphous silicon by: (a) controlling the reactant gas ratios and flow rates to have a relatively low concentration of silicon-containing precursor in the reaction mixture; and (b) having a predetermined amount of oxygen present during the photochemical reaction to combine with the silicon in any excess silicon-containing precursor and incorporate the silicon in a chemically homogeneous manner into the deposited layer.

In FIG. 1 there is presented a curve showing the experimental data for the refractive index and the hardness of the improved silicon oxynitride material as a function of the NH$_3$:SiH$_4$ reactant ratio at a SiH$_4$ flow rate of 1.2 standard cubic centimeters per minute (sccm). The improved silicon oxynitride material was deposited on a silicon substrate, such as a 3-inch wafer, in accordance with the present invention as previously described herein, at 175° C. and an operating pressure of 3.3 torr. The source of oxygen was residual air in the reaction chamber after evacuation to a base pressure of about 5 millitorr (5 micrometers of mercury). Separate layers were deposited on separate substrates using various NH$_3$:SiH$_4$ reactant gas ratios. The refractive index of each deposited layer was determined by ellipsometry. The hardness of each deposited layer was determined as scratch resistance relative to that of a thermal silicon oxide, and is designated as relative scratch resistance (RSS) in FIG. 1.

By examining FIG. 1, it can be seen that at low ratios of NH$_3$:SiH$_4$, such as a ratio of 60:1 or less, an increase in film hardness occurred as the refractive index decreased. In addition, at increasing NH$_3$:SiH$_4$ ratios (i.e. 80:1 to 160:1), the changes in refractive index became small with an increasing NH$_3$:SiH$_4$ ratio and a significant improvement in film hardness was observed. Thus, a ratio of NH$_3$:SiH$_4$ in excess of 80:1 is preferred, with a ratio of 300:1 or higher having been found to be especially advantageous.

Figure 2:
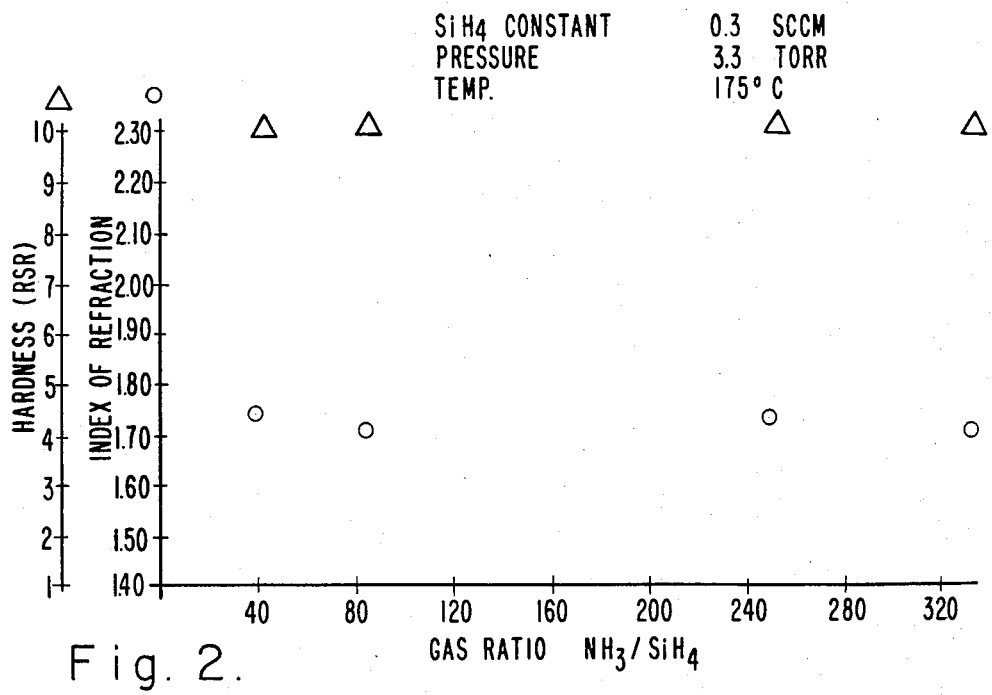
FIG. 2 presents a curve showing the same type of relationship as shown in FIG. 1 except that a $SiH_4$ flow rate of 0.3 standard cubic centimeters per minute is used.

In FIG. 2 there is presented a curve similar to that of FIG. 1, showing the refractive index and the hardness of the improved silicon oxynitride material of the present invention as a function of the NH$_3$:SiH$_4$ reactant ratio, except that a SiH$_4$ flow rate of 0.3 sccm used, which is a significantly reduced flow rate as compared to that used to generate the data of FIG. 1. As shown in FIG. 2, under conditions of limited SiH$_4$ concentration produced by the reduced SiH$_4$ flow rate, the film hardness and refractive index were independent of the reactant gas ratio. The latter result is due to the constant low level background concentration of oxygen (or air) in the deposition reaction chamber which provided sufficient oxygen to react with the reduced amount of silyl radicals produced from the reduced amount of silane at a given time.

Thus, by plotting curves similar to those shown in FIGS. 1 and 2, one may readily determine the required NH$_3$:SiH$_4$ ratio for a given constant flow rate of SiH$_4$ and a given operating pressure. In addition, similar curves may be generated using other nitrogen-containing reactants and other silicon-containing reactants which are capable of undergoing a photochemical reaction to deposit silicon nitride.

The new and improved silicon oxynitride material formed by the process of the present invention was determined to have a typical refractive index between 1.7 and 1.8. In addition, Fourier transform infrared (FTIR) spectroscopy showed no evidence of excess silicon or Si—H bonding in the new silicon oxynitride material, as discussed in further detail below. Thus, it can be concluded that the silicon oxynitride material formed in accordance with the present invention contains silicon, nitrogen, and oxygen atoms which are homogeneously chemically bonded to each other, without the undesired heterogeneous mixing of free amorphous silicon therewith as in the prior art photonitride material.

In Table I below there is presented a comparison of the data obtained from Fourier transform infrared spectroscopy of a photonitride film (Sample C) formed in accordance with the process of the present invention and having a refractive index of 1.7, a photonitride film (Sample A) having a refractive index of 2.0, and a thermal nitride film (Sample B) having a refractive index of 2.0. Table I lists the peak positions, vibrational mode assignments, and relative strengths for each sample, from which the types of chemical bonds within each type of nitride material can be determined.

Sample A was prepared in accordance with the process of U.S. Pat. No. 3,620,827 as modified by v.d. Brekel et al, as previously described herein, using a $NH_3:SiH_4$ ratio of 42:1, a $SiH_4$ flow rate of 1.2 sccm, and a temperature of 175° C. to deposit a photonitride film on a silicon substrate. Sample A was found to have a refractive index of 2.0 and a relatively low scratch resistance. As indicated by the data in Table I for Sample A, the strongest mode is a silicon-nitrogen stretch mode ($\nu_1 SiN$), which is characteristic of a thermal nitride film, as indicated for Sample B in Table I. (Sample B was prepared by a known thermal process using $SiH_4$ and $NH_3$ at a temperature of 800° C.) In addition, it can be seen in Table I that Sample A has some prominent features that are absent or not as pronounced as those of the thermal nitride of Sample B. For example, the silicon-oxygen stretch mode ($\nu_1 SiO$) is relatively stronger in Sample A than in Sample B. This particular mode is characteristic of oxygen contamination (interstitial oxygen) in nitride films and silicon wafers. Further, a prominent silicon-hydrogen stretch mode and very weak nitrogen-hydrogen modes are present in Sample A, whereas they are absent in Sample B. In addition, Sample A shows a very weak silicon-oxygen stretch mode ($\nu_3 SiO$) which is characteristic of a mode in a silicon monoxide type structure.

Sample C was formed in accordance with the process of the present invention using a $NH_3:SiH_4$ ratio of 250:1, a $SiH_4$ flow rate of 0.3 sccm, a temperature of 175° C., a silicon substrate, and residual air in the reaction chamber after evacuation to about 5 millitorr as the oxygen source. Sample C was found to have a refractive index of 1.7 and relatively high scratch resistance. The data in Table I indicate that the strongest mode is a silicon-nitrogen stretch mode ($\nu_2 SiN$), as for Sample A, except that this mode is at a higher position (880 cm$^{-1}$) for Sample C than for Sample A. It is believed that the large peak at 880 cm$^{-1}$ is mostly due to a mode from a silicon-nitrogen structure. In addition, Sample C shows a weak silicon-oxygen stretch mode ($\nu_2 SiO$) and a very weak silicon-oxygen bend mode, which are characteristic of modes in silicon dioxide.

It can be seen from the data of Table I that Sample A has a relatively higher SiH content and a relatively low NH content as compared to Sample C, which findings together indicate that Sample A has an excess of silicon relative to Sample C formed in accordance with the process of the present invention.

TABLE I

| | | | FTIR DATA ANALYSIS | | |
|---|---|---|---|---|---|
| | | | | RELATIVE STRENGTHS* | |
| | FTIR SPECTRUM* | | PHOTO-NITRIDE | THERMAL-NITRIDE | PHOTO-NITRIDE |
| PEAK (#) | PEAK POSITION (cm$^{-1}$) | MODE ASSIGNMENT (BOND STRUCTURE) | Sample A (n = 2.0) | Sample B (n = 2.0) | Sample C (n = 1.7) |
| 1 | 3380 | $\nu$NH | vw, br | — | w, br |
| 2 | 2160 | $\nu$SiH | w, br | — | vw, br |
| 3 | 1180 | $\beta$NH | vw | — | m, br |
| 4 | 1110 | $\nu_1$SiO | m | vw | — |
| 5 | 1060 | $\nu_2$SiO | — | — | w |
| 6 | 1020 | $\nu_3$SiO | vw | — | — |
| 7 | 880 | $\nu_2$SiN | — | — | vs, br |
| 8 | 830 | $\nu_1$SiN | s, br | vs, br | — |
| 9 | 810 | $\beta$SiO | — | — | vw |
| 10 | 460 | $\beta$SiN | m | m | w |

*$\nu$ = stretch,
$\beta$ = bend,
v = very,
s = strong,
m = medium,
w = weak,
br = broad Turning now to Table II, it can be shown that the photonitride of Sample C of the present invention which contains minimal free or amorphous silicon has improved physical and electrical properties relative to the photonitride of Sample A which contains excess silicon. To summarize the results shown in Table II, the silicon oxynitride material formed in accordance with the present invention has superior hardness, scratch resistance, adhesion, and resistivity as compared to a standard photonitride material. The improved properties of this silicon oxynitride material make it well suited for use as both a dielectric insulating layer and a passivation layer in semiconductor integrated circuits and devices. When the silicon oxynitride material of the present invention is used as a passivation layer on a semiconductor device, it has been found advantageous to provide a layer of silicon dioxide atop the silicon oxynitride layer to prevent long-term oxidation of the latter upon exposure to air.

TABLE II

| | Value | |
|---|---|---|
| | Standard Photonitride | Improved Silicon Oxynitride |
| Parameter | (Sample A) | (Sample C) |
| Refractive index | 1.9 to 2.0 | 1.7 to 1.8 |
| Resistivity | 2 × 10$^{14}$ ohm-cm. | 4 × 10$^{15}$ ohm-cm. |
| Hardness | — | See FIGS. 1 and 2 |

TABLE II-continued

| | Value | |
|---|---|---|
| Parameter | Standard Photonitride (Sample A) | Improved Silicon Oxynitride (Sample C) |
| Adhesion | — | Good* |
| Composition** | — | 33% Si |
| | | 24% O |
| | | 43% N |

*Passes ASTM D3359 tape adhesion test.
**Determined by Auger electron spectroscopy.

While the present invention has been particularly described with respect to the preferred embodiments thereof, it will be recognized by those skilled in the art that certain modifications in form and detail may be made without departing from the intention and scope of this invention. In particular, the present invention is not limited to the specific reactant ratios and flow rates disclosed herein, but includes any reactant ratios and flow rates which may be required to limit the concentration of the silicon-containing precursor in the reaction chamber to a sufficiently low level that the predetermined amount of oxygen provided can react with any excess silicon-containing precursor and chemically bond the silicon therein to prevent the heterogeneous incorporation thereof into the deposited material in the form of amorphous silicon. In addition, it is anticipated that the improved silicon oxynitride material of the present invention may be formed by a mercury-sensitized photochemical reaction between other silicon-containing compounds and other nitrogen-containing compounds, in addition to the $SiH_4$ and $NH_3$ specifically disclosed herein. Further, the improved silicon oxynitride material of the present invention may be deposited on any suitable substrate, of which the silicon substrate disclosed herein is just one example. Finally, the source of the predetermined amount of oxygen required in the process of the present invention is not limited to the specific sources disclosed herein, but includes other sources of oxygen as may be known in the art.

What is claimed is:

1. A photochemical vapor deposition process for depositing on the surface of a selected substrate a homogeneously chemically bonded silicon oxynitride material which contains minimal free amorphous silicon, comprising the steps of:
   (a) providing said substrate in a photochemical vapor deposition chamber;
   (b) forming a vapor phase mixture comprising:
      (i) a nitrogen-containing compound and a silicon-containing compound capable of undergoing a photochemical reaction with each other in the presence of radiation of a selected wavelength in a ratio and at flow rates to form a silicon nitride material;
      (ii) mercury-vapors as a sensitizer for said photochemical reaction; and
      (iii) an oxygen-containing compound;
   (c) exposing said substrate to said vapor phase mixture and simultaneously introducing into said chamber said radiation of a selected wavelength sufficient to induce said photochemical reaction between said nitrogen-containing compound, said silicon-containing compound, and said oxygen-containing compound to form said homogeneously chemically bonded silicon oxynitride material which deposits on said surface of said substrate, wherein said oxygen-containing compound is present in an amount to react with any excess said silicon-containing compound to chemically bond and homogeneously incorporate silicon from said excess silicon-containing compound into said silicon oxynitride material and thereby prevent the formation of said free amorphous silicon from said silicon-containing compound and the heterogeneous incorporation of said free amorphous silicon into said silicon oxynitride material.

2. The process set forth in claim 1 wherein said oxygen-containing compound is oxygen and said amount thereof is the amount of oxygen present in said chamber when evacuated to a pressure of about 0.1 to 50 torr (millimeters of mercury).

3. The process set forth in claim 1 wherein said oxygen-containing compound is dissociated during exposure to said radiation to form atomic oxygen.

4. The process set forth in claim 3 wherein said oxygen-containing compound is nitrous oxide.

5. The process set forth in claim 1 wherein the temperature of said substrate is between about 30° C. and 200° C.

6. The process set forth in claim 1 wherein:
   (a) said chosen nitrogen-containing compound is ammonia;
   (b) said chosen silicon-containing compound is silane;
   (c) said ratio of said ammonia to said silane is in excess of 80:1;
   (d) the flow rate of said silane is about 1.2 standard cubic centimeters per minute; and
   (e) said oxygen-containing compound is oxygen and said amount thereof is the amount of oxygen present in said chamber when evacuated to a pressure of about 5 millitorr (5 micrometers of mercury).

7. A low temperature photochemical vapor deposition process for depositing a homogeneously chemically bonded silicon oxynitride material on the surface of a selected substrate comprising the steps of:
   (a) providing said substrate in a photochemical vapor deposition chamber;
   (b) reducing the pressure in said chamber to a pressure of about 0.1 to 50 torr;
   (c) forming a vapor phase mixture comprising ammonia ($NH_3$) and silane ($SiH_4$) and mercury vapors as a photosensitizer; and
   (d) exposing said substrate in said chamber to said vapor phase mixture and simultaneously introducing into said chamber radiation of a wavelength sufficient to induce the photochemical reaction of said ammonia with said silane and ambient oxygen in said chamber at said pressure, to form said silicon oxynitride material which deposits on said surface of said substrate, wherein the ratio of said ammonia to said silane and the flow rate of said silane are sufficient to limit the concentration of said silane such that substantially all excess said silane reacts with said oxygen to chemically bond silicon from said excess silane into said silicon oxynitride material, to thereby provide a silicon oxynitride material that is homogeneously chemically bonded and contains substantially no free amorphous silicon.

8. A silicon oxynitride material characterized by being homogeneously chemically bonded, containing minimal free amorphous silicon, and having a refractive index within the range of about 1.7 to 1.8 formed by a photochemical vapor deposition process comprising the steps of:
- (a) providing a selected substrate in a photochemical vapor deposition chamber;
- (b) forming a vapor phase mixture comprising ammonia and silane in the ratio of 80:1 or higher, mercury-vapors as a sensitizer for the desired photochemical reaction, and oxygen; and
- (c) exposing said substrate to said vapor phase mixture and simultaneously introducing into said chamber radiation of a predetermined wavelength sufficient to induce said photochemical reaction between said silane, said ammonia, and said oxygen to form said silicon oxynitride material which deposits on the surface of said substrate, wherein said oxygen is in an amount which reacts with any excess said silane and chemically bonds silicon from said excess silane into said silicon oxynitride material, to thereby prevent formation of said free amorphous silicon from said silane and heterogeneous incorporation of said free amorphous silicon into said silicon oxynitride material.

* * * * *